(12) United States Patent
Kub et al.

(10) Patent No.: US 8,885,676 B2
(45) Date of Patent: *Nov. 11, 2014

(54) INFRARED LASER

(71) Applicants: Francis J. Kub, Arnold, MD (US);
Marc Currie, Gaithersburg, MD (US)

(72) Inventors: Francis J. Kub, Arnold, MD (US);
Marc Currie, Gaithersburg, MD (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 49 days.

This patent is subject to a terminal disclaimer.

(21) Appl. No.: 13/676,608

(22) Filed: Nov. 14, 2012

(65) Prior Publication Data
US 2013/0121362 A1    May 16, 2013

Related U.S. Application Data

(60) Provisional application No. 61/559,308, filed on Nov. 14, 2011.

(51) Int. Cl.
| H01S 5/00 | (2006.01) |
| H01S 3/11 | (2006.01) |
| H01S 3/09 | (2006.01) |
| H01S 3/113 | (2006.01) |
| H01S 5/06 | (2006.01) |
| H01S 3/091 | (2006.01) |
| H01S 3/10 | (2006.01) |
| H01S 3/06 | (2006.01) |
| H01S 5/14 | (2006.01) |
| H01S 5/10 | (2006.01) |
| H01S 3/083 | (2006.01) |
| H01S 5/50 | (2006.01) |
| H01S 5/028 | (2006.01) |
| H01S 5/34 | (2006.01) |
| H01S 5/183 | (2006.01) |

(52) U.S. Cl.
CPC .............. *H01S 3/10* (2013.01); *H01S 3/1118* (2013.01); *H01S 5/1032* (2013.01); *H01S 3/0906* (2013.01); *H01S 3/083* (2013.01); *H01S 3/113* (2013.01); *H01S 5/50* (2013.01); *H01S 5/0601* (2013.01); *H01S 3/091* (2013.01); *H01S 5/028* (2013.01); *H01S 3/06* (2013.01); *H01S 5/3401* (2013.01); *H01S 5/14* (2013.01); *H01S 5/1838* (2013.01)
USPC .............................. 372/22; 372/72

(58) Field of Classification Search
CPC . H01S 5/1838; H01S 5/18388; H01S 5/0267; H01S 5/005; H01S 3/10; H01S 3/091; H01S 3/086; H01S 5/1032; H01S 5/18361
USPC .............................. 372/50.22, 50.124, 50.23
See application file for complete search history.

(56) References Cited

U.S. PATENT DOCUMENTS

2012/0026504 A1* 2/2012 Yamada ................. 356/479
2012/0044793 A1* 2/2012 Fujita et al. ............ 369/47.25

* cited by examiner

*Primary Examiner* — Celleen A Matthews
*Assistant Examiner* — Tuan Nguyen
(74) *Attorney, Agent, or Firm* — US Naval Research Laboratory; Stephen T. Hunnius

(57) ABSTRACT

Laser devices are presented in which a graphene saturable absorber and an optical amplifier are disposed in a resonant optical cavity with an optical or electrical pump providing energy to the optical amplifier.

32 Claims, 7 Drawing Sheets

INFRARED LASER

REFERENCE TO RELATED APPLICATION

This application claims priority to and the benefit of U.S. Provisional Patent Application Ser. No. 61/559,308, filed Nov. 14, 2011, and entitled "Method for Implementing Infrared Laser", the entirety of which is hereby incorporated by reference.

BACKGROUND

Laser devices provide output from an optical cavity when an included gain medium overcomes the cavity losses so that amplification via stimulated emission occurs. Lasers produce light over some natural bandwidth or range of frequencies, sometimes referred to as the gain bandwidth, which is largely determined by the laser gain medium and the optical cavity or resonant cavity of the laser. Saturable absorbers can be introduced into the optical cavity to provide variability in the cavity loss, which is typically nonlinear such that when a small number of photons are present there is a larger cavity loss than when a large number of photons are present. This allows Q-switching to occur if the excited upper state lifetime of the gain medium is sufficiently long to accumulate enough energy to overcome the cavity losses by forming a pulse. Alternatively, if the gain bandwidth and laser cavity simultaneously support a large optical bandwidth, a saturable absorber can initiate mode-locking or phase-locking of the laser by providing lower loss to a multiple longitudinal optical modes with a specific phase relationship within the laser resonant cavity. Mode-locked lasers can produce extremely short duration light pulses, on the order of picoseconds or femtoseconds. Moreover, passive, hybrid, or active mode-locking can be produced in a laser. Active mode-locking can be accomplished using an external signal to induce intracavity light modulation. Passive mode-locking, in contrast, involves incorporation of a structural element, such as a saturable absorber into the laser cavity to cause self-modulation of the light. In this manner, passive mode-locked lasers use the light in the cavity to cause a change in some intra-cavity element, which will then itself produce a change in the intra-cavity light. Saturable absorbers exhibit intensity-dependent transmission or reflection, and thus behave differently depending on the intensity of the light. For passive mode-locking in a laser, an ideal saturable absorber selectively absorbs low-intensity light, while transmitting or reflecting light which is of sufficiently high intensity, thereby acting as an optical gate. Thusfar, implementing passive mode-locked or Q-switched infrared lasers has been difficult, especially at infrared wavelengths, and a need remains for improved laser devices and implementation approaches, particularly for compact laser device structures.

SUMMARY OF DISCLOSURE

Various details of the present disclosure are hereinafter summarized to facilitate a basic understanding, where this summary is not an extensive overview of the disclosure, and is intended neither to identify certain elements of the disclosure, nor to delineate the scope thereof. Rather, the primary purpose of this summary is to present some concepts of the disclosure in a simplified form prior to the more detailed description that is presented hereinafter.

Linear cavity, external cavity, extended cavity, and ring cavity laser devices and implementation approaches are provided in which a fixed or position-adjustable graphene saturable absorber structure, operating in the reflective or transmissive mode, is situated in the laser optical cavity, and various embodiments facilitate mode-locked or Q-switched operation at ultraviolet, visible, and/or infrared wavelengths. In various implementations, mode-locked lasers or Q-switched lasers employ semiconductor optical amplifiers (SOA) as the gain medium in combination with graphene saturable absorbers in a linear cavity or external cavity arrangement. In various implementations, mode-locked lasers or Q-switched lasers employ fiber or bulk crystal optical amplifiers (OA) as the gain medium in combination with graphene saturable absorbers in a linear cavity or external cavity arrangement. In certain embodiments, the graphene saturable absorber is integrated with the semiconductor optical amplifier or fiber or bulk crystal optical amplifier. Certain embodiments, moreover, provide laser implementations by integration of a graphene saturable absorber into a vertical cavity surface emitting laser (VCSEL) structure, integration of graphene saturable absorber into a vertical external cavity surface emitting (VECSEL) structure, and the combination of a graphene saturable absorber into an external cavity laser.

In accordance with one or more aspects of the present disclosure, a laser device is provided which includes first and second mirrors (flat or curved) with corresponding reflective surfaces that face one another to define a resonant linear optical cavity in which electromagnetic energy is amplified by stimulated emission of coherent radiation that is partially transmitted through the partially reflective second mirror (output coupler). A semiconductor optical amplifier and a graphene saturable absorber are disposed between the reflective surfaces and an electrical or optical pump provides current and/or light to the semiconductor optical amplifier. In certain embodiments, the device is a Q-switched laser or a mode-locked laser operable at center wavelengths of 1,800 nm or more and about 200 μm (1.5 terahertz) or less, and in the mode-locked case with a spectral width (spectral bandwidth) of as much as 10% or more of the center wavelength. In certain embodiments, the spectral widths can be more than 20% of the center wavelength. In various embodiments, moreover, a mode-locked or Q-switched laser device is provided which is operable at center wavelengths of about 280 nm or more and about 1,800 nm. Certain non-limiting embodiments provide a semiconductor optical amplifier comprising a periodic structure or chirped structure or graded structure of alternating superlattice with a periodic series of semiconductor layers of at least two different material compositions. Certain non-limiting embodiments provide a semiconductor optical amplifier comprising a double quantum well superlattice with two types of superlattice structures.

In certain non-limiting embodiments, the graphene saturable absorber is disposed between the reflective surface of the first mirror and the semiconductor optical amplifier. In certain non-limiting embodiments, the graphene saturable absorber is integral with the first mirror and is between the reflective surface of first mirror and the semiconductor optical amplifier. In certain non-limiting embodiments, the graphene saturable absorber is disposed between the semiconductor optical amplifier and the reflective surface of the second mirror. In certain non-limiting embodiments, the graphene saturable absorber is integral with the second mirror and is between the semiconductor optical amplifiers and reflective surface of the second mirror. The graphene saturable absorber may be integral to the semiconductor optical amplifier in certain embodiments, and the second mirror (the output coupler) may be integral to the semiconductor optical amplifier or may be spaced therefrom. In some embodiments, the second mirror (output coupler) can be a partially reflective facet on a second end of the semiconductor optical amplifier, or the second mirror may be a partially reflective coating on the second end of the semiconductor optical amplifier. In certain embodiments, the second mirror (output coupler) is spaced from the semiconductor optical amplifier, and may be a Bragg mirror. One or more optical components, such as a gas cell may be longitudinally disposed between the second end of the semiconductor optical amplifier and the second mirror in certain non-limiting embodiments.

In some embodiments, moreover, the graphene saturable absorber may be integral to the first mirror, where the first mirror can be a highly reflective coating on the graphene saturable absorber, or the first mirror can be a Bragg mirror (distributed Bragg reflector) or a highly reflective coating on a substrate or a metal substrate in certain non-limiting embodiments.

Certain embodiments of the laser device provide a graphene saturable absorber which is spaced from the semiconductor optical amplifier, and may include a gas cell, bandpass and other spectral filters, an etalon, a microelectromechanical (MEM) controlled etalon, polarizer, prisms, dispersive elements, lenses, or other optical component or components between the first end of the semiconductor optical amplifier and the graphene saturable absorber. For example, the graphene saturable absorber may be integral to the first mirror. In other embodiments, one or more optical components may be longitudinally disposed between the second end of the semiconductor optical amplifier and the second mirror.

In certain embodiments, the graphene saturable absorber is spaced from the first mirror, may be integral to the semiconductor optical amplifier, may be between the semiconductor optical amplifier and the second mirror (output coupler), or may be integral to the second mirror. One or more optical components, such as a gas cell may be located within the optical cavity and for example, may be disposed between the graphene saturable absorber and the first mirror.

In certain embodiments mirrors may not be discrete objects, but still confine the light within a resonant cavity, e.g. whispering-gallery waves, and the graphene saturable is integral with the cavity by direct or evanescent coupling with the resonant cavity.

In accordance with further aspects of the present disclosure, a linear cavity laser device is provided, which includes a first mirror with a first reflective surface, as well as a second mirror with a second reflective surface facing the reflective surface of the first mirror. The mirrors define a linear (longitudinal) resonant optical cavity, with a semiconductor optical amplifier disposed at least partially between the first and second reflective surfaces and an electrical or optical pump providing current or light to the semiconductor optical amplifier. In addition, a graphene saturable absorber is integral with the second mirror at least partially between the semiconductor optical amplifier and the second reflective surface. In certain embodiments, the graphene saturable absorber is spaced from the semiconductor optical amplifier. The semiconductor optical amplifier, moreover, can be a vertical cavity surface emitter laser (VCSEL) in certain non-limiting embodiments. The semiconductor optical amplifier in certain embodiments has first and second ends, with the graphene saturable absorber bonded to the second end, and the second mirror can be integral with the graphene saturable absorber to provide a monolithic laser structure.

A linear cavity laser device is provided in accordance with further aspects of the present disclosure, including first and second mirrors with corresponding reflective surfaces, along with a solid state optically pumped optical gain medium disposed at least partially between the reflective surfaces and an optical pump providing light to the solid-state optically pumped optical gain medium. In certain embodiments, the solid-state optically pumped optical gain medium can be an infrared (including near infrared or mid infrared) solid-state optically pumped optical gain medium. A graphene saturable absorber is disposed at least partially between the solid-state optically pumped optical gain medium and the first reflective surface. In certain embodiments, the optical gain medium is a rare earth doped fiber amplifier operable at wavelengths of about 1.4 µm or more and about 3.0 µm or less. In other embodiments, the solid-state optical gain medium includes at least one II-VI family doped crystal. In further embodiments, the solid-state optical gain medium includes at least one transition metal doped zinc chalcogenide, or may include at least one lead salt. In certain embodiments, moreover, at least one optical component, such as a gas cell, may be longitudinally disposed between the solid-state optical gain medium and the second mirror.

In accordance with further aspects of the disclosure, a linear cavity laser device is provided, which includes first and second partially reflective mirrors with corresponding reflective surfaces that define a longitudinal injection locked optical cavity, together with an electrically or optically pumped optical gain medium between the reflective surfaces, and a graphene saturable absorber disposed at least partially between the optical gain medium and the first reflective surface. A laser is disposed on a second side of the first partially reflective mirror to direct light at least partially toward the first partially reflective mirror. The linear cavity laser device may further include one or more gas cells or other optical components longitudinally disposed between the optical gain medium and the second mirror.

A ring cavity laser device is provided in accordance with further aspects of the disclosure, including first and second mirrors with corresponding reflective surfaces, as well as a third mirror with a third reflective surface, where the mirrors define a resonant optical cavity in which electromagnetic energy is amplified by stimulated emission of coherent radiation that is partially transmitted through the second mirror. An electrically or optically pumped optical gain medium is disposed at least partially between the first and second mirrors, and a graphene saturable absorber is disposed at least partially between the second and third reflective surfaces.

In various implementations, linear and/or ring cavities can be employed with more than two mirrors, for instance, to fold the cavity. Also, other optical elements (e.g., prisms, polarizers, dispersive elements, bandpass and other spectral filters, etc.) can be placed within the laser cavity.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION OF THE DISCLOSURE

Figure 1:
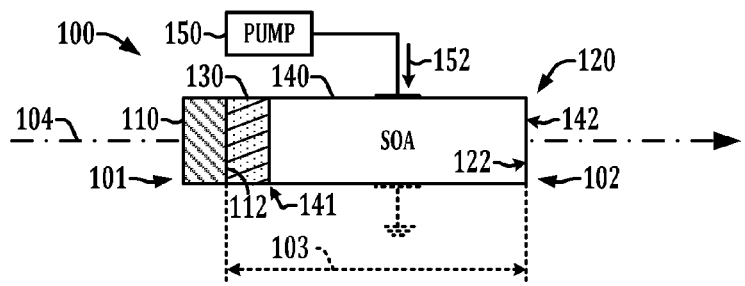
FIG. 1 is a partial sectional side elevation view illustrating a linear cavity laser device with a graphene saturable absorber and reflective mirror attached to a first facet end of a semiconductor optical amplifier.

One or more embodiments or implementations are set forth in conjunction with the drawings, where like reference numerals refer to like elements throughout, and where the various features are not necessarily drawn to scale.

Semiconductor optical amplifiers for ultraviolet, visible, and near infrared wavelengths typically have an interband design in which photons are emitted by the recombination of electron-hole pairs across the material bandgap. Semiconductor optical amplifiers for infrared wavelength can have interband cascade semiconductor optical amplifier design or quantum cascade semiconductor amplifier design. The interband cascade semiconductor optical amplifier laser typically operate in the wavelength range of 3-5 µm and quantum cascade semiconductor optical amplifier typically operate in the wavelength range of in the 5-18 µm but terahertz lasers to 200 micron wavelength have been experimentally demonstrated. The semiconductor optical amplifier designs typically have antireflective coatings on their facets and also can have tilted facets to reduce the refection of light back into the semiconductor optical amplifier.

Single mode or multimode laser devices are disclosed herein which include a graphene saturable absorber and at least two mirrors, wherein flat mirrors may be used, but alignment to a required precision may be difficult. Transmissive saturable absorbers may be employed, and extended cavities may be provided. One or more mirror positions may be adjustable to facilitate mode-locking, and quantum cascade laser (QCL) master-oscillator power-amplifiers (MO-PAs) may be included. In certain embodiments, moreover, polarization optics, and dispersive optics, spectral filters or other additional optical elements may be provided within the laser cavity, for instance, a MEMS controlled bandpass filter within the cavity. An output coupler may be provided, such as a one dimensional distributed feedback (1D-DFB), photonic crystal distributed feedback (PCDFB), or a ring cavity surface emitting (RCSE) QCLs. Substrate emitting DFB QCL configurations are contemplated in which the functions of the distributed feedback and the surface emission are separated. Certain embodiments provide substrate emitting quantum cascade ring lasers with high power single transverse mode QCLs and applications of plasmonics to achieving high beam quality (low divergence, multibeam operation etc.). Two section devices are contemplated where one section acts as the pumping section (referred to as master oscillator (MO) section) and the other section serves as a power amplifier (PA). The MO section features a DFB grating to ensure single-mode emission. Moreover, single mode quantum cascade lasers and plasmonic collimators are contemplated.

Mid-IR mode-locked laser may be fabricated from an inter-band cascade laser (ICL) in the 3-5 μm range and quantum cascade lasers (QCL) are provided in the 5-12 μm region. Short pulsed operation of these lasers previously has not been achieved due to the poor energy storage capabilities of the gain media. While this hinders pulsed operation of these materials via Q-switching, it does not affect the mode-locked operation. Producing a burst of photons by switching the gain or loss in a laser cavity requires storing energy in the laser's excited state and then suddenly modulating this gain/loss within the cavity to produce a pulse. This, however, is not the only way to produce optical pulses. Mode-locking a laser produces optical pulses by "locking" the phase of a large number of longitudinal modes within the laser, similar in concept to phasing a series of harmonic sine waves to produce a step. This theory exploits the operation of many continuous wave (cw) optical modes in the cavity by locking their phases, thereby creating an optical pulse without energy storage.

Referring initially to FIGS. 1-4, various non-limiting laser device embodiments are hereinafter illustrated and described, in which a graphene saturable absorber 130 is provided in the laser optical cavity or resonator. The type of linear cavity in certain embodiments may be a "Fabry-Perot" optical cavity. Graphene is substantially an sp2 bonded carbon layer which forms in a two-dimensional honeycomb crystal lattice layer or sheet with a carbon-carbon bond length of about 0.142 nm. Multiple stacked sheets may form with an interplanar spacing of about 0.335 nm, and may be stacked in certain arrangements such as A-B (Bernal) ordering. One exemplary linear cavity laser device 100 with a first end 101 and a second end 102 is shown in FIG. 1, including a first highly reflective mirror 110 with a first reflective surface 112, and a second partially reflective mirror 120 with a second reflective surface 122 at least partially facing the first reflective surface 112 of the first mirror 110. The mirrors in various embodiments can be flat or curved. The mirrors 110 and 120 define a laser optical resonator or optical cavity with a cavity length 103 extending along a longitudinal axis 104 in which electromagnetic energy is amplified by stimulated emission of coherent radiation that is partially transmitted through the second mirror 120. Within the optical cavity is a semiconductor optical amplifier (SOA) 140 disposed at least partially between the first and second reflective surfaces 112 and 122, which is provided or "pumped" with energy (e.g., electrical current or light) 152 via an electrical or optical pump 150. The semiconductor optical amplifier in certain embodiments may have anti-reflection coatings on the facets and can have titled facets to reduce the stimulated emission light back into semiconductor optical amplifier. In addition, a graphene saturable absorber 130 is disposed in the optical cavity at least partially between the mirrors 110 and 120. In certain embodiments, the graphene saturable absorber structure 130 can be an antiresonant design, or a resonant design, or a no resonant design.

Figure 2A:
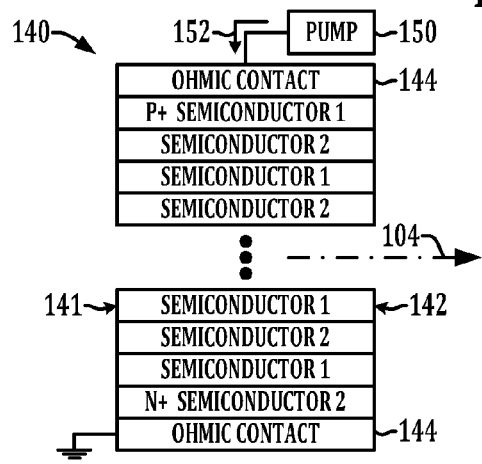
FIG. 2A is a partial sectional side elevation view illustrating a P-N quantum cascade superlattice semiconductor optical amplifier.
Figure 2B:
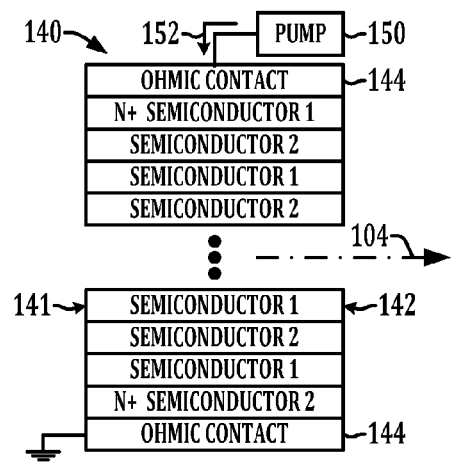
FIG. 2B is a partial sectional side elevation view illustrating an N-N quantum cascade superlattice semiconductor optical amplifier.

Any type of semiconductor optical amplifier 140 can be used. As seen in FIGS. 2A and 2B, certain implementations of the SOA 140 include a superlattice with a periodic series of semiconductor layers of at least two different material compositions in a waveguide configuration. In the example of FIG. 2A, the SOA 140 extends between first and second facets or ends 141 and 142, respectively, and includes a P-N quantum cascade superlattice configuration, with an uppermost layer of a first semiconductor type (SEMICONDUCTOR 1) being heavily doped with a P type dopant (P+) and a lower most semiconductor layer of a second type (SEMICONDUCTOR 2) being N-doped (N+). The facets 141, 142 can be coated for antiflectivity and can be titled. In the case that the graphene saturable absorber 130 is bonded to the first end of the SOA 140, the facet is generally not titled in certain non-limiting embodiments. The facet 141 and/or 142 can be titled for the case that the graphene saturable absorber 130 is bonded to the second end of the SOA 140. Ohmic contacts 144 are provided at the top and bottom of the SOA superlattice structure 140 in the illustrated embodiment, for connection to an electrical pump 150 and an electrical reference or ground by which the SOA 140 is pumped with electrical current 152 in certain implementations. In other embodiments, the SOA 140 can be optically pumped via an optical pump 150 providing light 152 to the SOA structure 140. FIG. 2B shows another embodiment of the SOA 140, in which the uppermost and lower most semiconductor layers of the superlattice structure are both doped with dopants of the same conductivity type (N+). Quantum Cascade Laser embodiments can be implemented as a waveguide on a semiconductor.

In the example of FIG. 1 (as well as the examples of FIGS. 3-10), the graphene saturable absorber 130 is longitudinally disposed between the first reflective surface 112 and the SOA 140. In addition, the graphene saturable absorber 130 in FIG. 1 is integral with the first end or facet 141 of the SOA 140, and the second mirror 120 is integral with the second SOA end or facet 142. In certain non-limiting implementations, the second (partially reflective) mirror 120 can be a partially reflective facet on the second end 142 of the SOA 140. In other possible implementations, the second mirror 120 is formed as a partially reflective coating on the second end 142 of the SOA 140. In practice, the laser device 100 can be a Q-switched laser or a mode-locked laser configured to emit stimulated coherent radiation with center wavelengths of about 1,800 nm or more and about 25,000 nm or less and having a spectral width as much as 10% or more of the center wavelength through the second mirror 120. Mode-locked laser devices 100 have been created with 0.006% spectral widths to 15% spectral widths. In certain embodiments, the spectral width can be greater than 0.5%, and as much as 10% or more. In further nonlimiting embodiments, the spectral width is greater than 2%. In certain embodiments, the graphene saturable absorber can be bonded to the first end of the SOA. In other possible implementations, the laser 100 is a Q-switched or mode-locked device, operable to emit stimulated coherent radiation with center wavelengths of about 280 nm or more and about 1,800 nm or less and having a spectral width as much as 10% or more of the center wavelength through the second mirror 120.

Figure 13:
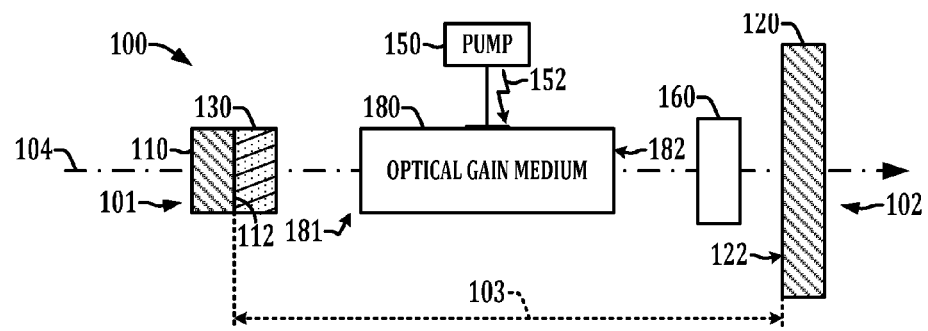
FIG. 13 is a partial sectional side elevation view illustrating a linear cavity laser device with a graphene saturable absorber and a solid state optically pumped infrared optical amplifier or gain medium.
Figure 14:
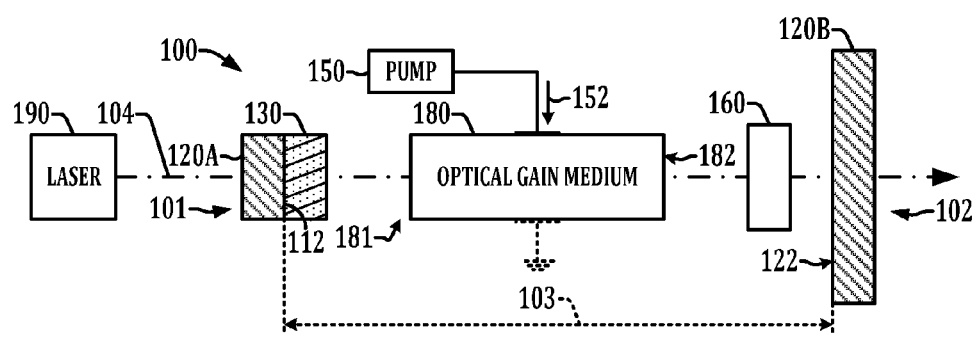
FIG. 14 is a partial sectional side elevation view illustrating a linear cavity laser device with a graphene saturable absorber and two partially reflective mirrors forming an injection locked (coupled) optical cavity with a laser to direct light at least partially toward a second side of the first partially reflective mirror.
Figure 15:
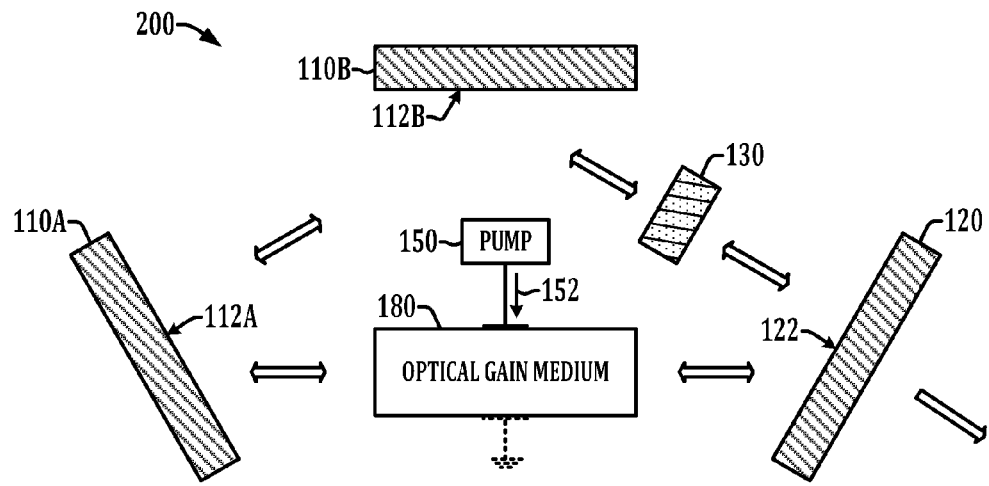
FIG. 15 is a partial sectional side elevation view illustrating a ring cavity laser device with two highly reflective mirrors and a partially reflective mirror, including an optical amplifier or gain medium disposed between a first one of the highly reflective mirrors and the partially reflective mirror, and a graphene saturable absorber disposed at least partially between the second highly reflective mirror and the partially reflective mirror.

Passive mode-locked or Q-switched laser operation involves an optical gain media 140, 170, 180 that operates at the operation wavelength, as well as an optical cavity for feedback, and a saturable absorber 130 that is effective at the operational wavelength. Various non-limiting embodiments are illustrated and described below in connection with FIGS. 3-15, each employing graphene saturable absorber 130 in combination with an optical gain medium such as an SOA 140 (FIGS. 1-10), a semiconductor optical amplifier or vertical cavity surface emitter laser (VCSEL) (FIGS. 11 and 12) or other optical amplifier medium (FIGS. 13-15).

Graphene saturable absorbers 130 facilitate broadband operation through gapless linear dispersion of Dirac electrons. The optical absorption, ultrafast carrier relaxation time, and controllable modulation depth of graphene have been actively measured, and the thermal conductivity of monolayer graphene was measured to be approximately 5000 $\mu m^{-1}$ $K^{-1}$ at room temperature, which is the highest value ever found among any natural material. In addition, several graphene mode-locked fiber lasers have been demonstrated at wavelengths near 1000 nm and 1550 nm. Wide-range wavelength tunability was also realized in both mode-locked and Q-switched fiber lasers. In particular, the use of graphene saturable absorbers 130 for mode-locked or Q-switched lasers 100 facilitates operation at infrared wavelengths. One passive approach to make a mode-locked laser 100 is to combine a saturable absorber with optical gain medium in an external cavity. However, conventional semiconductor saturable absorbers do not operate in the infrared wavelengths. The inventors have appreciated the graphene performs well as a saturable absorber 130 for all infrared wavelengths, and thus a mode-locked or Q-switched laser 100 can be implemented at infrared wavelengths by combining the graphene saturable absorber 130 with an optical gain medium (e.g., SOA 140 in this embodiment). Graphene's performance as saturable absorber is different from conventional semiconductor saturable absorbers in that conventional semiconductor saturable absorbers are engineered for each individual wavelength of operation, whereas a graphene saturable absorber does not need any additional engineering and operates in a similar fashion at all wavelengths from the visible through the infrared.

The combination of the SOA 140 with the graphene saturable absorber 130 in a longitudinal or linear cavity arrangement also facilitates mode-locking or Q-switching operation of the laser 100. The use of an SOA 140 as the gain medium for infrared wavelength advantageously facilitates provision of optical gain at wavelengths ranging from approximately 230 nm to 14,000 nm by appropriate design of the quantum well structure in certain embodiments of an SOA 140. Other optical gain mediums such as rare earth doped fiber amplifiers are not readily available for operation at wavelengths longer than approximately 5,000 nm, but a quantum cascade semiconductor optical amplifier (QCSOA) 140 operates as an optical gain medium from approximately near infrared to far infrared. In addition, the SOA 140 can be combined with the graphene saturable absorber 130 in an external cavity arrangement to implement a compact mode-locked or Q-switched laser 100, wherein compact monolithic designs are also possible (e.g., FIGS. 1 and 12). In certain embodiments, for example, the graphene saturable absorber 130 can be integrated with the SOA 140 to make an especially compact laser 100. In addition, the SOA 140 can be electrically pumped in certain embodiments to facilitate creation of a compact laser device 100. Other embodiments (e.g., FIGS. 11 and 12) integrate the graphene saturable absorber 130 with a VCSEL structure 170 to likewise facilitate implementation of a compact laser structure. Moreover, other optical gain mediums can be used, such as a rare earth doped fiber optical amplifier in combination with a graphene saturable absorber 130 to implement infrared mode-locked or Q-switched laser device 100. In addition, while primarily illustrated in connection with electrically pumped SOAs 140 and other optical gain mediums 170, 180, graphene saturable absorbers 130 can also be used in various embodiments in combination with optically pumped SOAs 140 and VCSELs 170. In certain embodiments, the laser 100 can be mode-locked or Q-switched for wavelengths within a wavelength band from 2.0 µm to 12 µm.

The optical gain medium (whether an SOA 140, a semiconductor diode laser or vertical cavity semiconductor optical amplifier VCSOA 170, or other optical amplifier 180) can in certain embodiments be pumped by a second light source, such as another laser (e.g., 190 in FIG. 14 below). For example, infrared light can be amplified in the optical gain medium 140, 170, 180 using an electrically driven solid-state laser. Alternatively, the gain media can be an optically pumped fiber, an optically pumped crystal, an optically pumped semiconductor optical amplifier in various embodiments. A mode-locked laser can be implemented in a variety of laser arrangements, for example a linear cavity (e.g., FIGS. 1-13), a ring cavity (e.g., FIG. 15), and an extended semiconductor laser cavity (e.g., FIG. 14), including the optical gain medium within the optical cavity. In each of these arrangements, the graphene saturable absorber 130 can be used in transmission or reflection mode. The graphene saturable absorber 130, due to its atomic layer thickness and its ability to be grown on one substrate then transferred to different substrates, can be integral with one of the mirrors 110, 120 in certain embodiments for double pass use in reflection.

One factor in implementing a Q-switched laser device 100 is the storage time for optically excited carriers in the optical amplifier medium 140, 170, 180. In particular, if the optical amplifier storage time is short it is difficult to make a Q-switched laser, however, it may be possible to make a mode-locked laser. Semiconductor optical amplifiers designed for infrared wavelengths such as Quantum Cascade SOA devices 140 or intersubband SOAs 140 typically only have a short storage time which would allow mode-locked laser operation but may not facilitate Q-switched laser operation. Semiconductor optical amplifiers 140 designed for wavelengths less than 1,700 nm can have a storage time that is sufficiently long to enable Q-switched operation. Mode-locked operation is also possible.

Figure 3:
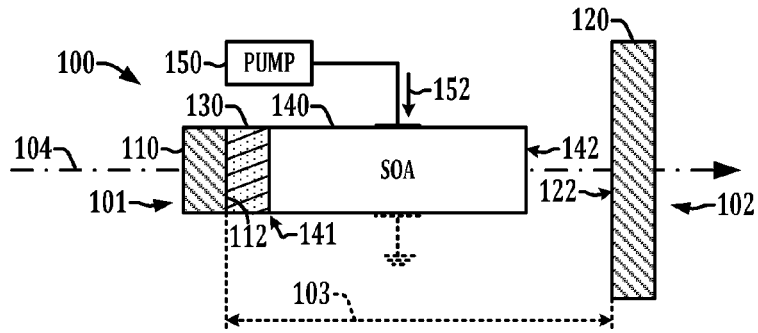
FIG. 3 is a partial sectional side elevation view illustrating a linear cavity laser device with a graphene saturable absorber and reflective mirror attached to a first facet end of a semiconductor optical amplifier, as well as a partially reflective mirror spaced from the second facet end of the semiconductor optical amplifier.

The embodiments of FIGS. 1-3 provide an integrated graphene saturable absorber 130 and the SOA 140 in an optical cavity, where the cavity includes a highly reflective mirror 110 on a first side 101, a graphene saturable absorber 130 between the highly reflective mirror 110 and a first facet end 141 of the SOA 140 with the graphene saturable absorber 130 preferably monolithically integrated with the first facet 141. An electrically (or optionally optically) pumped SOA 140 optical gain medium is operable at the selected wavelength and can also have narrow band or broad band operation, and a partially reflective mirror 120 can be formed either on the second facet surface 142 of the SOA 140, or an optional partially reflective mirror 120 can be spaced from the second facet 142 (FIG. 3) that performs as the output coupler of the laser device 100 on the second side 102.

The graphene saturable absorber 130 can be constructed so as to advantageously provide optical absorption over a wide range of wavelengths from ultraviolet (UV) to terahertz wavelengths, along with a high damage threshold and tunable response set in certain embodiments by selecting the number of graphene layers used in forming the saturable absorber 130. In this regard, graphene films may be formed as sheets as thin as one atom thick, and the saturable absorption response can be tuned/modified by increasing the number of layers of graphene. Graphene has a high optical damage threshold, which can be particularly advantageous for Q-switched and mode-locked lasers 100 that produce peak irradiances greater than 10 GW/cm$^2$. Moreover, graphene material 130 has a very high thermal conductivity, which is useful for removing absorbed heat in both the saturated and unsaturated cases.

In practice, the graphene saturable absorber 130 can operate in either a transmission mode or a reflection mode. In certain embodiments, the graphene saturable absorber structure can be an antiresonant or resonant or no resonant design. A graphene saturable absorber 130 designed for the transmission mode can optionally be combined with a partially reflective mirror 120 in certain embodiments. One design for a partially reflective second mirror 120 may include a Bragg mirror (also referred to as a dielectric mirror or distributed Bragg reflector) which can be any structure having an alternating sequence of layers of two or more different optical materials, typically dielectric or semiconductor layers, designed for specified reflectivity at different wavelengths of light. A dielectric distributed Bragg reflector typically has alternating layers of dielectric materials and a semiconductor distributed Bragg reflector typically has alternating layers of semiconductor materials. In other embodiments, a thin film coating or coatings on a substrate can also be used to implement the partially reflective mirror 120, which may be integral with the second end 142 of the SOA 140 in certain implementations. The Bragg Reflector (or Distributed Bragg Reflector) may have reflectivity from a "periodic structure" and not strictly reflection from a first reflective surface.

In one non-limiting example, the graphene saturable absorber 130 can include graphene material epitaxially grown on a silicon face of a silicon carbide (SiC) substrate. The graphene material typically grows approximately one or several graphene sheet thick on the on-axis silicon-face of SiC. A Bragg material design or thin film deposited on the SiC material or bonded to the SiC can implement a partially or highly reflective mirror 110, where the example of FIG. 1 may be implemented as a highly reflective first mirror 110 integrated with the graphene saturable absorber 130. In other embodiments (e.g., FIGS. 11 and 12 below), the graphene saturable absorber 130 can be integrated with the second end 142 of the optical gain medium 140, 170, 180 and/or with the partially reflective second mirror 120 by a variety of fabrication techniques.

In other non-limiting embodiments, the graphene material 130 can be epitaxially grown on the carbon face of a SiC substrate, where such graphene material typically grows 10 graphene sheets to 40 graphene sheets thick. A partially or highly reflective mirror 110, 120 can be implemented as discussed above for such embodiments.

In other implementations, the graphene saturable absorber material 130 can be grown on a metal material and can then be transferred and bonded to a transparent substrate such as diamond substrate, sapphire substrate, quartz substrate, silicon substrate, SiC substrate, etc. A Bragg mirror material design or thin film can be deposited on the SiC material or bonded to the SiC in order to implement a partially reflective or highly reflective mirror 110, 120.

In further non-limiting embodiments, graphene flakes, graphene nanoplatelets, graphene nanosheets, graphene oxide flakes, graphene oxide nanoplatelets, graphene oxide nanosheets, graphene material, or fluorographene material, etc can be deposited on a transparent substrate such as a diamond substrate, a sapphire substrate, a quartz substrate, a silicon substrate, a partially reflective mirror substrate, reflective mirror substrate, a substrate with a Bragg mirror, SOA first end, SOA second end, fiber optical amplifier first end, fiber optical amplifiers second end, bulk crystal optical amplifier first end, bulk crystal optical amplifier second end, etc., to provide the saturable absorber 130. A Bragg material design or thin film deposited on the SiC material or bonded to the SiC can implement a partially reflective or highly reflective mirror 110, 120.

Still other possible non-limiting embodiments of the graphene saturable absorber 130 can be created by incorporating the graphene material (including graphene flakes, graphene nanoplatelets, graphene nanosheets, graphene oxide flakes, graphene oxide nanoplatelets, graphene oxide nanosheets, graphene material, fluorographene material, etc.) into a polymer and then depositing or coating these on a transparent substrate or partially or highly reflective mirror 110, 120. A Bragg material design or thin film deposited on the SiC material or bonded to the SiC can implement a partially or highly reflective mirror 110, 120. In this regard, diamond, boron nitride and SiC substrates advantageously provide high thermal conductivity, and are thus attractive for applications that would require high power absorption in the graphene saturable absorber 130. The silicon substrate, moreover, can be advantageous for infrared and terahertz application because of good transmission properties.

Using these and other fabrication techniques, the graphene saturable absorber 130 can be designed to operate in the reflection mode by growing, transferring, bonding, depositing graphene or graphene oxide material on a substrate or on a first facet 141 of a SOA 140 or by depositing a highly reflective coating on the graphene material 130. One design for a highly reflective mirror 110 is to use a Bragg material design mirror with a selected number of pairs. Thin film coating can also be used to implement highly reflective mirrors. In addition, a partially reflective mirror (e.g., the second mirror 120 in FIG. 1) can be implemented using the above-described or other techniques.

Referring now to FIGS. 2A and 2B, the semiconductor optical amplifier (SOA) in certain embodiments is preferably electrically pumped but can be optically pumped via a pump 150 providing current or light 152 to the SOA structure 140 (e.g., FIG. 1). The SOA 140 provides the optical gain medium that operates at the selected optical wavelength. The SOA 140 can have narrow band or broadband operation. For example, broadband operation is preferred for operation of the optical cavity for frequency comb spectroscopy for molecular sensing applications. The SOA 140 in certain embodiments may be a direct recombination SOA, quantum cascade SOA, an intersubband SOA, ridge waveguide SOA designs, a vertical cavity surface emitting SOA, and/or other SOA known to those skilled in the art. A quantum cascade or intersubband SOA design 140 can advantageously generate optical amplified light at infrared wavelengths between approximately 3 µm and approximately 24 µm wavelengths, and can generate terahertz wavelengths for special quantum cascade SOA designs. A direct recombination SOA 140 in certain embodiments can operate between approximately 240 nm and approximately 3 µm wavelengths. Lead salt material can also be used as semiconductor optical amplifier material.

In one non-limiting implementation, the highly reflective mirror 110 and the graphene saturable absorber 130 can be integral with the first facet surface 141 of the SOA 140. In certain embodiments, the first facet 141 of the SOA 140 can be cleaved and/or coated for maximum transmission. The light from the first facet 141 is coupled out of the SOA 140. A highly reflective mirror 110 on a graphene material 130 can be used in certain embodiments to reflect the light back into the SOA 140, with the graphene material 130 operating as a saturable absorber. The graphene saturable absorber 130 can be attached, bonded or deposited onto the SOA first facet or end 141. There are several approaches by which the graphene saturable absorber 130 can be integrated with the SOA 140.

One approach is to grow the graphene material 130 on a metal surface such as copper or nickel (not shown). The front surface of the graphene material 130 can be attached (bonded, glued, etc.) to the first facet 141 of the SOA 140. The metal material can then be optionally etched away leaving the graphene material 130 on the SOA first facet 141. A highly reflective mirror material 110 can then be deposited on the opposite side of the graphene material 130. One option for implementing the highly reflective material 110 on the graphene material 130 is to not etch away the metal material as discussed above, and simply use the metal as the reflective material 110. The graphene material 130 can also be deposited on the SOA facet 141 as graphene material flakes or graphene nanoplatelets. The graphene material 130 can also be incorporated into a polymer and then deposited or coated on the SOA facet 141. There is a minimal or no separation between the graphene material surface 130 and the SOA facet surface 141 in certain embodiments.

In the embodiment of FIG. 1, the second facet 142 or end of the SOA 140 is cleaved and/or coated to provide the output coupler for the laser device 100, thus constituting the partially reflective second mirror 120 with a partially reflective surface 122. As seen in FIG. 3, a separate partially reflective mirror 120 can be used instead of relying on the second facet 142 to implement a partially reflective mirror of the resonant cavity. The linear cavity laser in the illustrated embodiments can optionally include a region for sensing within the optical cavity, for example, for insertion of gas samples to be measured to determine the gas molecules within the region for sensing. The linear cavity laser 100 can be operated in certain embodiments in an optical frequency spectroscopy mode (e.g. frequency-comb spectroscopy) to permit enhanced sensing of the gas molecules within such region for sensing.

The disclosed laser devices 100 (and 200 in FIG. 15) in various embodiments provide certain advantages by use of a graphene saturable absorber 130, particularly for mode-locked or Q-switched operation. For example, the disclosed devices 100, 200 facilitate mode-locked operation at infrared wavelengths with center wavelengths in the range of 1,800 nm to 25,000 nm, with a spectral width as much as 10% or more of the center wavelength. In addition, certain non-limiting embodiments facilitate compact Q-switched or mode-locked laser structures operable with center wavelengths in the range of 280 nm to 1,800 nm and having a spectral width as much as 10% or more of the center wavelength. Various embodiments facilitate implementation of a high repetition, femtosecond laser at infrared wavelengths. Moreover, certain embodiments facilitate implementation of Frequency Comb Spectroscopy (which is a highly sensitive technique for performing molecular sensing) at infrared wavelengths, with comb frequency spread over a >1000 nm spectral width. Also, the disclosed devices 100, 200 can provide a compact laser by combining a graphene saturable absorber 130 with a semiconductor optical amplifier 140 in an external cavity. In this regard, the disclosed laser devices 100, 200 can be implemented as a compact laser by integrating a graphene saturable absorber 130 with a semiconductor optical amplifier 140 in an external cavity. Certain embodiments, moreover, provide a compact laser 100, 200 by integrating a graphene saturable absorber into a VCSEL structure (e.g., FIGS. 11 and 12 below).

Figure 4:
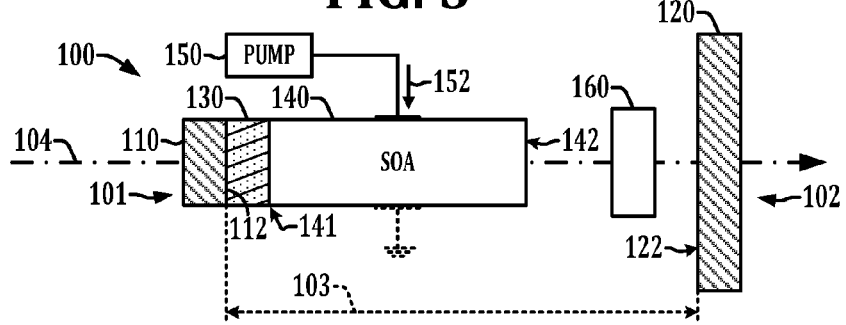
FIG. 4 is a partial sectional side elevation view illustrating a linear cavity laser device with a graphene saturable absorber and a gas cell or other optical component disposed between the second end of the semiconductor optical amplifier and the partially reflective mirror.

FIG. 4 illustrates another embodiment in which the second facet 142 of the SOA 140 can be cleaved and/or coated for maximum transmission, and a partially reflective mirror 120 performs as the output coupler of the laser 100. In addition, an optional gas cell or other optical component 160 can be located between the second facet 142 of the SOA 140 and the partially reflective mirror 120. For operation at infrared wavelengths longer than approximately 1,700 nm, one particularly advantageous optical cavity arrangement is as a linear optical cavity, particularly for situations in which optical isolators are not available to implement a ring cavity design. The optical cavity arrangement is also appropriate for lasers 100 that operate at center wavelengths less than 1,700 nm.

Referring also to FIGS. 5-9, certain embodiments may employ the graphene saturable absorber 130 spaced from the first end 141 of the SOA 140, where some embodiments (e.g., FIGS. 6 and 8) may also provide one or more optical components 160, such as a gas cell in certain implementations, disposed between the graphene saturable absorber 130 and the first SOA facet end 141.

Figure 5:
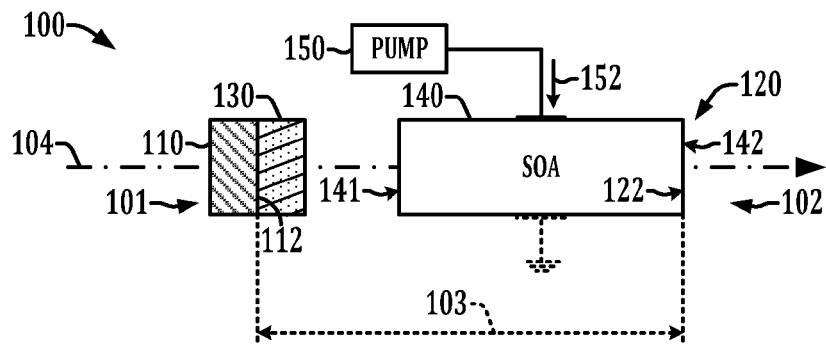
FIG. 5 is a partial sectional side elevation view illustrating a linear cavity laser device with a graphene saturable absorber integral with a highly reflective first mirror and longitudinally spaced from the semiconductor optical amplifier, as well as a partially reflective mirror integral with the second end of the semiconductor optical amplifier.
Figure 8:
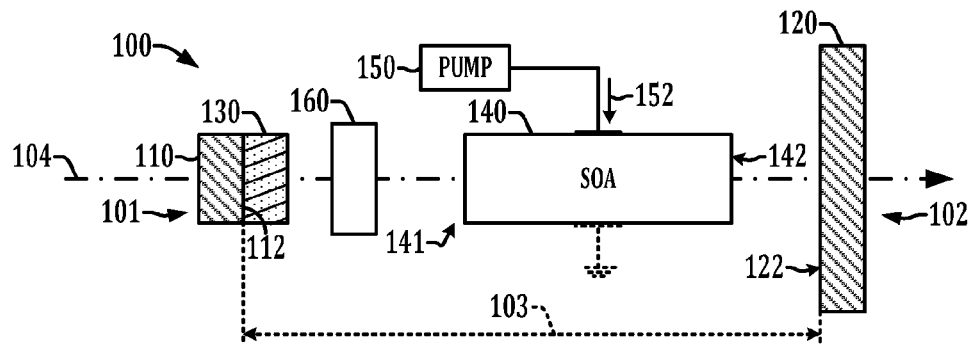
FIG. 8 is a partial sectional side elevation view illustrating a linear cavity laser device with a graphene saturable absorber integral with a highly reflective first mirror and an optical component disposed between the graphene saturable absorber and the semiconductor optical amplifier, including a separate partially reflective mirror facing the second end of the semiconductor optical amplifier.
Figure 9:
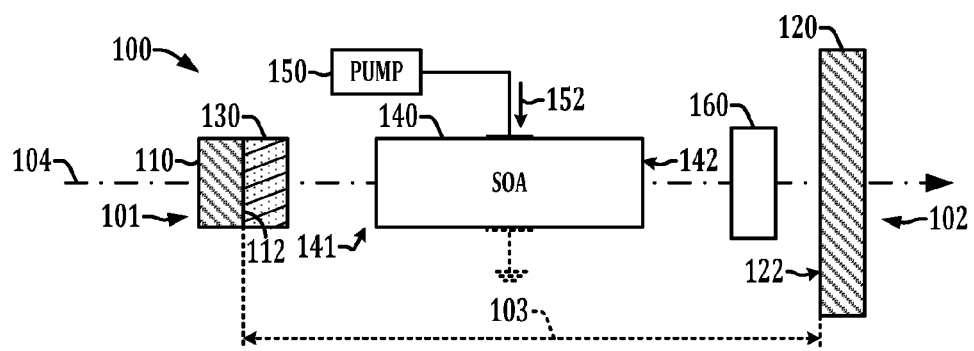
FIG. 9 is a partial sectional side elevation view illustrating a linear cavity laser device with a graphene saturable absorber and a gas cell or other optical component located between the second end of the semiconductor optical amplifier and the partially reflective second mirror.

Some embodiments, moreover, may employ one or more optical components 160 (e.g., a gas cell in certain implementations) disposed at least partially between the second SOA facet end 142 and the second mirror 120, as seen in FIG. 9. In certain implementations, moreover, the graphene saturable absorber 130 may be integral with the first mirror 110. As seen in FIG. 5, for example, this provides a structure including a graphene saturable absorber 130 in combination with an SOA 140 in an extended optical cavity of the device 100. As seen in FIGS. 5-9, moreover, the optical cavity includes a highly reflective mirror 110 on a first side 101, a graphene saturable absorber 130 between the highly reflective mirror 110 and a first facet 141 of the SOA 140 (in one arrangement, the graphene saturable absorber 130 can be integrated with the mirror 110).

Figure 6:
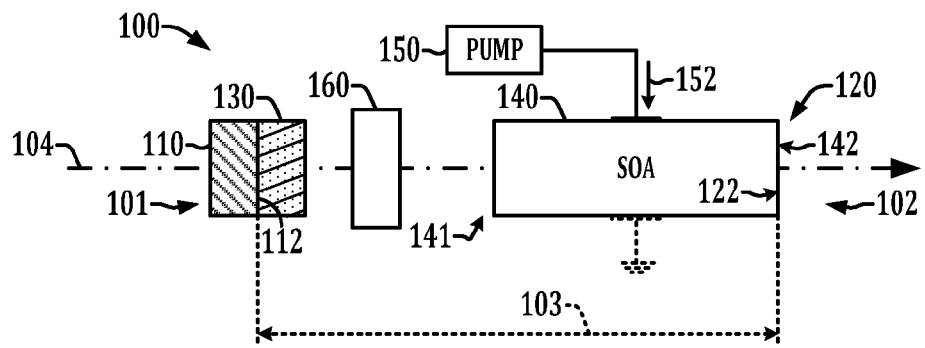
FIG. 6 is a partial sectional side elevation view illustrating a linear cavity laser device with a graphene saturable absorber integral with a highly reflective first mirror and a gas cell or other optical component disposed between the graphene saturable absorber and the semiconductor optical amplifier, with a partially reflective mirror integral with the second end of the semiconductor optical amplifier.
Figure 7:
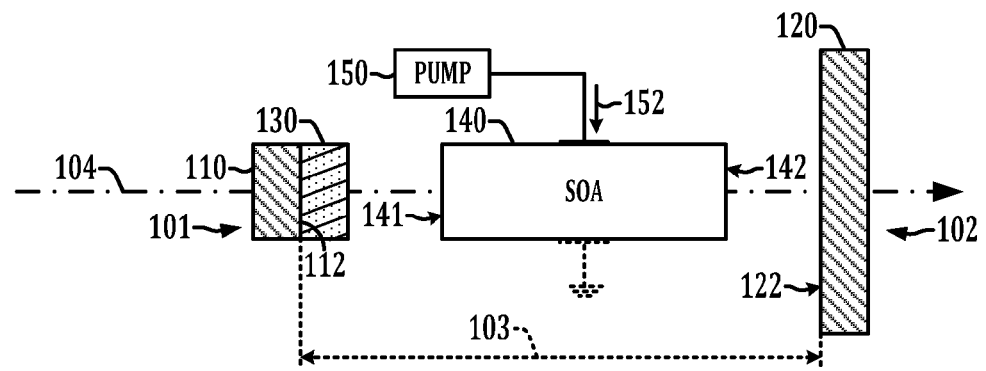
FIG. 7 is a partial sectional side elevation view illustrating a linear cavity laser device with a graphene saturable absorber integral with a highly reflective first mirror and longitudinally spaced from the semiconductor optical amplifier, with a separate partially reflective mirror facing the second end of the semiconductor optical amplifier.

In addition, as seen in FIGS. 6 and 8, an optional gas cell or other optical component 160 can be disposed at least partially between the highly reflective mirror 110 and the SOA first facet 141. The SOA 140 can be electrically or optically pumped, and can operate at the selected wavelength for narrow band or broadband operation. In addition, a partially reflective mirror 120 can be formed either on the SOA second facet surface 142 or as a separate partially reflective mirror structure 120 separated from the second facet 142 that operates as the output coupler of the resulting laser device 100 on the second side of the optical cavity 102.

Figure 10:
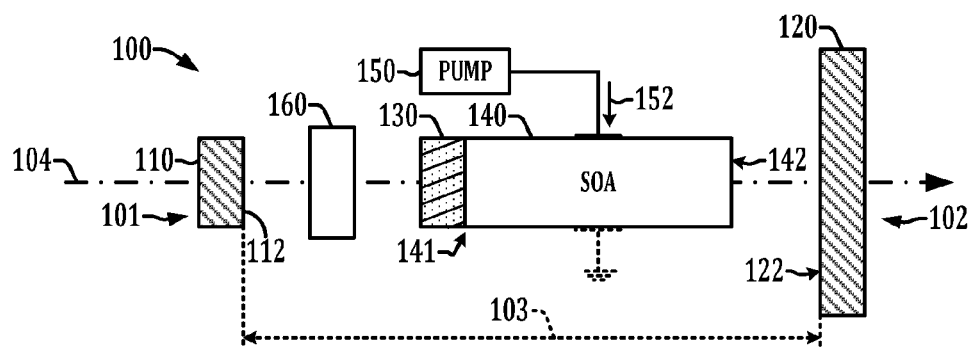
FIG. 10 is a partial sectional side elevation view illustrating a linear cavity laser device with a graphene saturable absorber deposited or bonded onto a first facet end of the semiconductor optical amplifier, as well as an optical component disposed between the graphene saturable absorber and the highly reflective first mirror.

FIG. 10 illustrates another non-limiting embodiment of the laser device 100, in which the graphene saturable absorber material 130 is integrated with the first facet 141 of the SOA 140. In certain implementations, at least one optical component 160 is longitudinally disposed between the graphene saturable absorber 130 and the first mirror 110 as seen in FIG. 10, and other implementations are possible in which no optical component 160 is provided in the device 100. In certain embodiments, moreover, the graphene material 130 can be integrated with the SOA 140, for example, with graphene being deposited or bonded to the first facet surface 141 in certain implementations.

Figure 11:
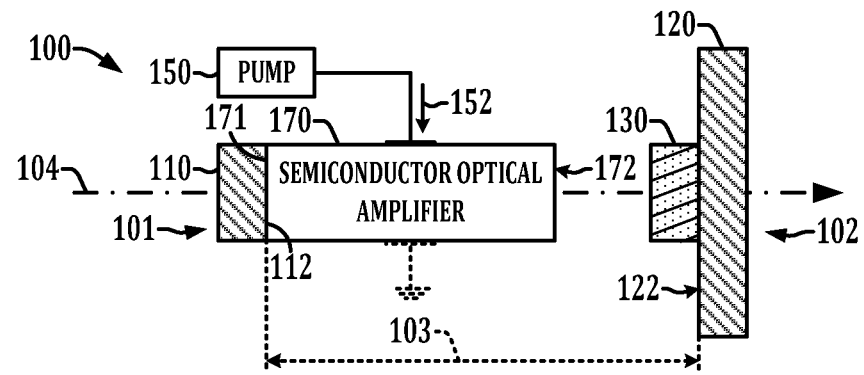
FIG. 11 is a partial sectional side elevation view illustrating a linear cavity laser device including a graphene saturable absorber and an integrated partially reflective second mirror.
Figure 12:
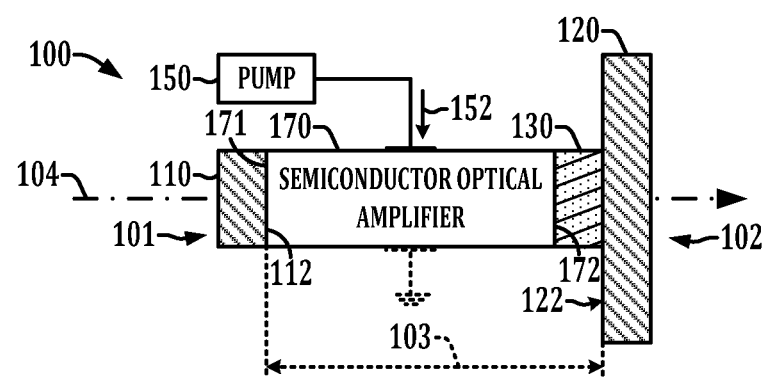
FIG. 12 is a partial sectional side elevation view illustrating a linear cavity laser device with a graphene saturable absorber bonded to the second facet end of the semiconductor optical amplifier and having an integrated partially reflective second mirror.

Referring also to FIGS. 11, 12 and 18-20, FIG. 11 illustrates a linear cavity (external cavity) laser device 100 including a graphene saturable absorber 130 and an integrated partially reflective second mirror 120, where the graphene saturable absorber 130 may be spaced from a second facet end 172 of the optical gain medium 170 as shown in FIG. 11, or may instead be integrated with the optical gain medium 170 as shown in FIG. 12. As with the above embodiments, the first and second mirrors 110 and 120 define a resonant optical cavity to establish a standing wave (or a traveling wave) of electromagnetic energy and to facilitate emission of stimulated coherent radiation through the second mirror 120. The mirror 110 can be a Distributed Bragg Reflector (DBR), a DBR in combination with a metal reflector, or a metal reflector. The optical gain medium in the embodiments of FIGS. 11 and 12 is a semiconductor optical amplifier 170 with a first facet end 171 and a second facet end 172 disposed at least partially between the first and second reflective surfaces 112, 122 of the mirrors 110, 120, respectively. The second facet end 172 can be coated with antireflecting material or antireflection materials to reduce the reflection of light back into the semiconductor optical amplifier 170. The second facet end can also be tilted to reduce the reflection of light back into the semiconductor optical amplifier. An electrical or optical pump 150 is operable to provide electrical current and/or light to the semiconductor optical amplifier 170.

In these embodiments, the graphene saturable absorber 130 is integral with the second mirror at least partially between the semiconductor optical amplifier 170 and the second reflective mirror surface 122. Any form of semiconductor optical amplifier 170 can be used in these embodiments. For instance, the semiconductor optical amplifier can be a vertical cavity surface emitter optical amplifier (VCSOA) 170 disposed at least partially between the first and second reflective surfaces 112, 122. In the embodiment of FIG. 12, moreover, the graphene saturable absorber 130 can be bonded to or deposited on the second end 172 of the semiconductor optical amplifier 170 with optional spacer layer between the graphene saturable absorber and the second end 172. The process of bonding the graphene saturable absorber to the second end 172 can be a process or direct bonding, adhesive bonding, or other bonding approach. The second end 172 can be the surface of the vertical cavity semiconductor optical amplifiers gain region and can also be the surface of the semiconductor. Additional material such as semiconductor material or dielectric material can be deposited or bonded to the surface of the graphene saturable absorber 130 to act as a phase shift layer or spacer layer. The second mirror 120 can be integral with or onto the graphene saturable absorber 130 to provide a monolithic laser structure.

In certain embodiments, the second mirror 120 can be a partially reflecting distributed Bragg reflector. In certain embodiments, the graphene saturable absorber can be integral with the second mirror 120 with an optical spacer material, and then the graphene saturable absorber and second mirror can be bonded to the second end 172 or to a spacer material layer on the surface of the second end 172. In certain embodiments, the graphene saturable absorber 130 can be bonded to the second end 172 or to a spacer material on the surface of the second end and then a distributed Bragg reflector can be grown on the surface of the graphene saturable absorber or on the surface of a spacer material deposited on the surface of the graphene saturable absorber 130. The separation between the second mirror 120 and the second end 172 can be controlled by a MEMS device to change the length of the cavity. The mirror 110 can be a Distributed Bragg Reflector (DBR), a DBR in combination with a metal reflector, or a metal reflector.

Figure 18:
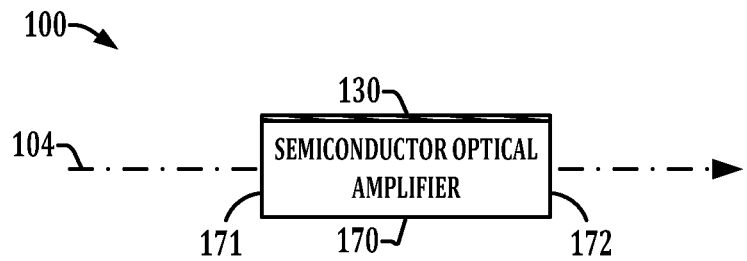
FIGS. 18-20 are partial side elevation views illustrating further details of vertical cavity embodiments.
Figure 19:
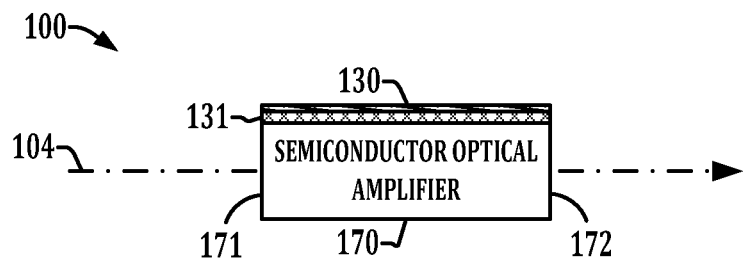
Figure 20:
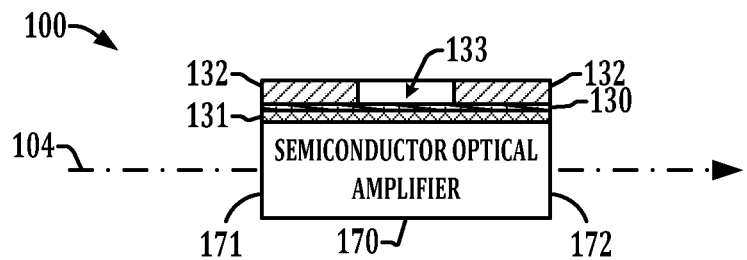

As seen in FIGS. 18-20, a graphene saturable absorber 130 can optionally function as, and/or form a part of, a top electrode for the VCSOA, and may be a transparent electrode for the VCSOA. A metal layer used to form mirror 110 or a metal layer on the bottom surface of the DBR that forms mirror 110 can function as the bottom electrode for the VCSOA. In FIG. 18, a graphene layer 130 is formed on the top side of the SOA 170 to function as a transparent top electrode for the VCSOA. In FIG. 19, an optional spacer material layer 131 can be formed on the top side of the SOA 170, with the graphene layer 130 being formed above the spacer material layer 131. As seen in FIG. 20, moreover, the vertical cavity device can include a metal structure or layer 132 formed over the graphene 130 (with or without the optional spacer layer 131).

In the example of FIG. 20, moreover, the top metal electrode structure 132 includes an opening 133 exposing at least a portion of the graphene layer 130. Various different implementations are possible in which a top electrode is formed above (directly or with intervening structures or materials) a top surface of the SOA 170, where the top electrode can include a graphene material layer, preferably transparent. In this regard, the graphene material layer 130 forming at least a part of the top electrode structure can operate as a saturable absorber. In certain implementations (e.g., FIGS. 19 and 20), a spacer material layer 131 is provided between the upper surface of the SOA 170 and the graphene material layer 130. Certain embodiments of the top electrode, moreover, can include a metal structure 132 formed (directly or indirectly) over the graphene 130. In addition, such a metal structure 132 can be a ring structure with a cylindrical opening 133 as shown in FIG. 20, or can be a solid layer, or can include an opening or aperture 133 of any suitable size and shape which exposes at least a portion of the graphene material layer 130. The vertical current flow in the VCSOA, in this regard, can be confined by the design of the top metal electrode 132 and/or by oxygen ion implant or by other approaches known to those skilled in the art. The top metal electrode 132 can be a ring shape with an opening 133 in the center for light emission. The top metal electrode 132 can contact the graphene saturable absorber 130 which can function as a transparent electrode to facilitate a uniform vertical current flow and/or larger light emission area. Current flow confinement approaches such as oxygen ion implantation or proton ion implantation can be used to aid in confining the vertical current flow to the active region of the vertical cavity semiconductor optical amplifier (VCSOA) or vertical cavity surface emitting laser (VCSEL) in the case that the second mirror is integral to the VCSOA with integral graphene saturable absorber or VECSEL for the case that the second mirror is separated from the VCSOA.

In one possible implementation, the partially reflective mirror 120 and the graphene saturable absorber 130 are integral with the same substrate. The second facet 172 of the solid-state gain medium 170 is cleaved or ion milled (optionally at a tilt angle) and/or coated for maximum transmission and/or minimum reflection in certain nonlimiting embodiments. The light from the second facet 172 is coupled out of the gain medium 170, and a partially reflective mirror 120 on a graphene material 130 is used to reflect the light back into the optical gain medium 170. The graphene material 130 performs as a saturable absorber, and can be attached, bonded or deposited onto the second facet 172 of the optical gain medium 170, and/or to the partially reflective mirror substrate 120 or onto a separate transparent substrate (not shown). The partially reflective mirror 120 can be implemented in certain embodiments as a Bragg design or maybe implemented as thin film material.

There are several approaches by which the graphene saturable absorber 130 can be integrated with the partially reflective mirror 120 or the gain medium second facet 172. One non-limiting approach is that the graphene material 130 can be first grown on a metal surface (not shown) such as copper or nickel. The front surface of the graphene material 130 can be attached (e.g., bonded, glued, etc.) to the mirror substrate 120 and/or to the second facet 172. The metal material can then be optionally etched away leaving the graphene material as a transparent material on the mirror substrate. A partially reflective mirror material 120 can then be deposited on the other side of the graphene material 130. The graphene material 130 can also be deposited on the partially reflective mirror substrate 120 or second optical gain medium facet 172 as graphene material flakes or graphene nanoplatelets and certain non-limiting implementations. The graphene material 130 can also be incorporated into a polymer and then deposited or coated on the partially reflective mirror 120 or second facet 172 of the optical gain medium 170. The linear cavity laser 100 in certain embodiments can optionally include a region for sensing within the optical cavity for insertion of gas samples to be measured to determine the gas molecules within the sensing region. In addition, the linear cavity laser 100 can be operated in the Frequency Comb Spectroscopy mode to permit enhanced sensing of the gas molecules within such sensing region.

In these embodiments of FIGS. 11 and 12, moreover, the first mirror 110 is integrated with the first SOA facet 171, or can be a Bragg mirror integrated within the optical gain medium 170. Moreover, an electrically or optically pumped gain medium 170 operates in certain embodiments at the selected wavelength and can also have narrow band or broadband operation. In the implementation of FIG. 12, the graphene saturable absorber material 130 can be bonded to the second facet 172 of the gain medium 170, and the partially reflective mirror 120 can be integrated with the graphene saturable absorber 130 to implement a monolithic or near monolithic laser structure 100. In one non-limiting implementation, the partially reflective mirror 120 and the graphene saturable absorber 130 can be integral with the same substrate. The second facet 172 of the solid-state gain medium 170 may be cleaved and/or coated for maximum transmission in certain embodiments, such that the light from the second facet 172 is coupled out of the gain medium 170. The partially reflective mirror 120 may be integrated with the graphene material 130 so as to reflect the light back into the gain medium 170. The graphene material 130 performs as a saturable absorber, and can be attached, bonded or deposited onto the second facet 172, or onto the partially reflective mirror substrate 120 or onto a separate substrate. The partially reflective mirror 120 in certain embodiments can be implemented as a Bragg design or may be implemented by thin film material.

There are several approaches by which the graphene saturable absorber 130 can be integrated with the partially reflective mirror 120 or the second facet 172. For example, the graphene material 130 can be first grown on a metal surface such as copper or nickel, and the front surface of the graphene material 130 can be attached (bonded, glued, etc.) to the mirror substrate 120 or the second facet 172. The metal material can then be optionally etched away leaving the graphene material 130 on the facet 172. A highly reflective mirror material can then be deposited on the other surface of the graphene 130. The graphene material 130 can also be deposited on the partially reflective mirror substrate 120 or the second facet 172 as graphene material flakes or graphene nanoplatelets. The graphene material 130 can also be incorporated into a polymer and then deposited or coated on the partially reflective mirror substrate 120 or second facet 172. The linear cavity laser 100 can also include a region for sensing within the optical cavity for inserting gas samples to be measured to determine the gas molecules within the sensing region. In addition, the linear cavity laser can be operated in the Frequency Comb Spectroscopy mode to permit enhanced sensing of the gas molecules within the sensing region.

Referring also to FIGS. 13 and 14, a linear cavity laser device 100 is provided with a first mirror 110 with a first reflective surface 112 and a second mirror 120 with a second reflective surface 122 which at least partially faces the first reflective surface 112. The first and second mirrors 110 and 120 define a resonant optical cavity in which electromagnetic energy is amplified by stimulated emission of coherent radiation that is partially transmitted through the second mirror 120. A solid-state optically pumped infrared optical gain medium 180 is disposed at least partially between the first and second reflective surfaces 112 and 122, and is pumped via an optical pump 150 providing light to the optical gain medium 180. In addition, a graphene saturable absorber 130 is disposed at least partially between the solid-state optically pumped infrared optical gain medium 180 and the first reflective surface 112. The gain medium 180 in certain embodiments can be a rare earth doped fiber amplifier operable at wavelengths of about 1400 nm or more and about 3000 nm or less. In other embodiments, the solid-state gain medium 180 includes at least one II-VI family doped crystal. Further embodiments provide an optical gain medium 180 that includes at least one transition metal doped zinc chalcogenide, or at least one lead salt. Moreover, various embodiments may include one or more optical components 160 (e.g., a gas cell) longitudinally disposed between the solid-state optical gain medium 180 and the second mirror 120 as shown in FIGS. 13 and 14, or such may be omitted in other implementations.

In these embodiments, the resonator or laser optical cavity is created with a solid-state optically pumped gain medium 180 within the optical cavity. In certain embodiments, the solid-state optically pumped optical gain medium can be an infrared (including near infrared or mid infrared) solid-state optically pumped optical gain medium. Typical types of solid-state optical gain mediums 180 include crystals, glasses, ceramics, or composite laser material doped with rare earth ions, doped with transition metal ions, or semiconductor gain medium. The ion doped solid-state laser 100 can be made in the form of bulk laser, fiber laser or other types of waveguide lasers. The solid-state laser 100 may generate output power at levels between a few milliwatts and many kilowatts.

The solid-state optically pumped laser embodiments 100 may be either end pumped or side pumped in certain embodiments. The solid-state optically pumped gain medium 180 may have the geometry of a fiber, rod, slab, microchip, etc. Many solid-state lasers are optically pumped with flash lamps, arc lamps, or laser diodes. The laser transitions of rare-earth doped or transition metal doped solid-state optically pumped gain mediums 180 are normally weakly allowed transitions; i.e. transitions with very low oscillator strength, which leads to long radiative upper-state lifetime and consequently yields good energy storage with long upper-state lifetimes of microseconds to milliseconds and is thus advantageous for Q-switched lasers 100. The laser crystal can easily store an amount of energy which, when released in the form of a nanosecond pulse, leads to a peak power which is orders of magnitude above the average power.

In mode-locked operation, the solid-state laser 100 can generate ultra-short pulses with durations on the order of picoseconds or femtoseconds. Passive mode-locking can have Q-switching instabilities which are suppressed via suitable design and operational control, including parameters such pump energy, energy storage lifetime, cavity length, etc. Most rare-earth doped laser crystals, such as Nd:YAG and NdYVO$_4$ have small gain bandwidths so that tuning is possibly only within a rather limited range. Tuning ranges of tens of nms and more are possible with rare-earth-doped glasses, and particularly with transition-metal doped crystals such as Ti:sapphire, Cr:LiSAF and Cr:ZnSe (vibronic lasers).

In some solid-state gain mediums 180, particularly in those doped with transition metal ions, there is a strong interaction of the electronic states with lattice vibrations (phonons). This vibrational-electronic (vibronic) interaction leads to a strong homogeneous broadening and thus a large gain bandwidth. Examples of solid-state gain medium material include rare earth doped fiber amplifier such as erbium-doped fiber amplifiers that operate at wavelengths from 1500 to 1600 nm. Other examples include doped crystals of the II-VI family, for example, $Cr_2+$:ZnSe chromium doped II-VI compound based lasers as the most successful room-temperature diode-pumpable sources in the wave-length range between about 2 µm and about 3.5 µm; Cr:CdSe; $Fe_2+$:ZnSe lasers can emit at wavelengths of about 3.7 µm to 5.1 µm; and $Cr_2+$:CdMnTe. Other possible implementations can employ transition metal-doped zinc chalcogenides, such as Tm:YAL, Tm:YAG, Rare earth doped or transition metal doped laser ceramics, and/or lead salt such as PbSSe, PbSnTe, PbSnSeTe and/or PbSnS.

The infrared gain material 180 preferably absorbs light at one or more wavelengths (e.g., from the optical pump 150) and amplifies light in the desired infrared 2000 to 6000 nm optical band. The optically pumped infrared gain material 180 performs the functions of a gain medium that operates at the operational wavelength, and creates infrared light within the optical cavity which can be amplified. In this linear laser cavity, the optically pumped infrared gain material 180 is located between two mirrors 110 and 120 which provide the feedback for the laser device 100. In addition a graphene saturable absorber 130 is placed within the cavity. The location of the graphene saturable absorber 130 in certain embodiments will modify the performance of the laser device 100 to produce the desired mode-locked laser pulses.

Optional optical devices 160 such as lenses, folding mirrors, spectral filters, polarization and dispersive optics can be inserted between the mirrors 110, 120 in order to improve the device performance. The laser output can be transmitted through one or more of the mirrors 110, 120, e.g., from a beam splitter, or from an intra-cavity reflection. A further variation can include a highly reflective mirror (e.g., mirror 110) on a first side of the optical cavity, a graphene saturable absorber 130 between the highly reflective mirror 110 and a first facet 181 of the optical amplifier material 180 (in one arrangement, the graphene saturable absorber 130 can be integrated with the mirror 110), an optional gas cell 160 located between the mirror 110 and the facet 181 of the optical gain medium 180, an optically pumped optical gain medium 180 that operates at the selected wavelength and can also have narrow band or broad band operation, and a partially reflective mirror 120 separated from the second facet 182 of the gain medium 180 which performs as the output coupler of laser device 100 on the second side 102 of the optical cavity. The linear cavity laser 100 may include a sensing region within the optical cavity for inserting gas samples to be measured to determine the gas molecules within the sensing region, and the laser device 100 can be operated in the Frequency Comb Spectroscopy mode to permit enhanced sensing of the gas molecules within sensing region.

FIG. 14 illustrates a linear cavity laser device 100 with a graphene saturable absorber 130 and two partially reflective mirrors 120A and 120B, respectively, forming an injection locked (coupled) optical cavity with a laser 190 to direct light at least partially toward a second side of the first partially reflective mirror 120A. An optical gain medium 180 is disposed at least partially between the first and second reflective surfaces 112, 122 of the respective mirrors 120A and 120B, and is pumped by an electrical or optical pump 150 that provides electrical current or light to the gain medium 180. A graphene saturable absorber 130 is disposed at least partially between the optical gain medium 180 and the first reflective surface 112, and the laser 190 directs light at least partially toward the first partially reflective mirror 120A. In certain embodiments, one or more optical components 160 can be longitudinally disposed between the optical gain medium 180 and the second mirror 120, for example, a gas cell. The saturable absorber 130 in this embodiment, as with the other embodiments illustrated and described herein, can be a graphene material or a graphene-containing material, and can be integrated with the partially reflective mirror 110 as shown. The mirror 110, moreover, can include a mirror coating on the graphene material 130, or the graphene material 130 can be formed on a mirror structure 110, or the partially reflective mirror 110 can be formed on a separate substrate in various embodiments.

FIG. 15 shows a ring cavity laser device 200 in accordance with further aspects of the present disclosure, which includes two highly reflective mirrors 110A and 110B with reflective surfaces 112A and 112B, respectively, along with a partially reflective mirror 120 providing an output coupling for the device 200. An optical amplifier or gain medium 180 is disposed between the mirror 110A and the partially reflective mirror 120, and a graphene saturable absorber 130 is disposed at least partially between the second highly reflective mirror 110B and the partially reflective mirror 120. In this configuration, a reflective surface 112B of the mirror 110B at least partially faces the reflective surfaces 112A and 122 of the other mirrors, and the same is true of the other mirrors, whereby the reflective surface of each mirror at least partially faces that of the other mirrors. Moreover, in this configuration, the mirrors 110A, 120 and 110B define an optical ring cavity to establish a standing wave of electromagnetic energy and to facilitate emission of stimulated coherent radiation through the second mirror 120. An electrical or optical pump 150 provides current or light to the optical gain medium 180, and the graphene material 130 operates as a graphene saturable absorber 130 disposed at least partially between the second and third reflective surfaces 122 and 112B. Various embodiments are possible, wherein the graphene saturable absorber 130 can operate in the transmission mode in certain embodiments. The gain medium 180 in certain embodiments can be an optical pumped fiber or crystal gain medium, or an electrically biased (electrically pumped) semiconductor optical amplifier (SOA).

In various nonlimiting implementations, the optical gain medium 180 can be contacted by one or more of the reflective surfaces 112, 122 and/or by an optical element 160.

Figure 16:
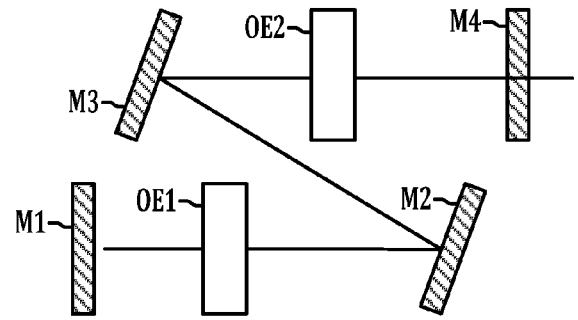
FIG. 16 is a partial sectional side elevation view illustrating a linear cavity laser device with four mirrors and two optical elements, in which at least one of the optical elements is a graphene saturable absorber.
Figure 17:
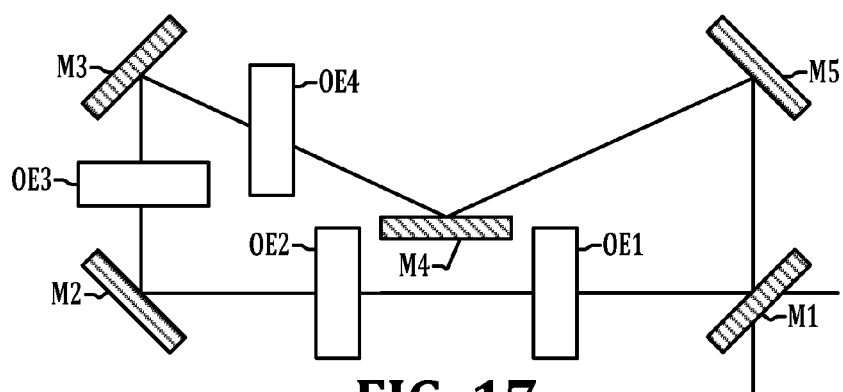
FIG. 17 is a partial sectional side elevation view illustrating a ring cavity laser device with five mirrors and four optical elements, with at least one of the optical elements being a graphene saturable absorber.

Referring now to FIGS. 16 and 17, a linear cavity laser device and/or a ring cavity laser device may include more than two mirrors and at least one graphene saturable absorber. In this regard, the device shown in FIG. 16 is linear cavity laser device with four mirrors M1-M4 and two optical elements OE1 and OE2, in which at least one of the optical elements OE1 and/or OE2 is a graphene saturable absorber. FIG. 17 shows an exemplary ring cavity laser device with five mirrors M1-M5 and four optical elements OE1-OE4, where at least one of the optical elements OE1-OE4 is a graphene saturable absorber.

In certain nonlimiting implementations, a bandpass filter component can be provided within the cavity. In certain embodiments, an etalon can be provided in combination with a spectral filter to establish multi wavelength operation. In addition, the facet on the output end may be an anti-reflection coating, and the facet may be titled in certain embodiments to prevent or mitigate feedback (e.g., minimize or reduce Fabry-Perot resonances) due to the residual facet reflectivity. Moreover, the output coupler in certain embodiments can be an external mirror with partial reflectivity. In certain embodiments, the mode-locked laser can be implemented using passive mode locking, but embodiments are contemplated in which hybrid mode locking is used (takes advantage of both the stability offered by an actively mode-locked system and the pulse shortening mechanisms provided by the saturable absorber (SA)). For instance, a hybrid mode-locked (HML) monolithically integrated indium phosphide (InP) laser can be used, where the hybrid mode-locking scheme takes advantage of both the stability offered by an actively mode-locked system and the pulse shortening mechanisms provided by the graphene saturable absorber (SA). In other embodiments, a hybrid SOA-Raman amplifier can be used in conjunction with a graphene saturable absorber.

In certain embodiments, moreover, the emission can be out of the bottom of the substrate (e.g., the light goes horizontal and then vertical near the end). Quantum Cascade Amplifiers, for example, can have an emission out of the bottom substrate, and the graphene saturable absorber may be bonded to the back surface of the substrate. In a substrate emitting DFB QCL configuration, the functions of the distributed feedback and the surface emission may be separated.

Moreover, various embodiments can employ frequency tuning by varying the current (e.g., electrically pumped embodiments). In various embodiments, a Quantum Cascade Amplifier can be combined with a Bragg region. Strong feedback needed for single-mode operation may be obtained by a first-order Bragg grating. A dispersive element can be used in certain embodiments, for example a diffraction grating in a laser with an external cavity in order to spectrally filter the radiation reflected in the laser amplifier in order to produce globally single-mode laser radiation. Another example of a dispersive element implementation involves replacing one or more of the Bragg mirrors with a chirped Bragg mirror, thereby altering the spectral phase of the light as it is reflected by the applied chirp. One possible design for a Quantum Cascade Amplifier is a Master Oscillator Power Amplifier (MOPA) in which a Bragg region is used to select out a signal mode. For such embodiments, the graphene saturable absorber can be located between the Quantum Cascade output facet and the external mirror.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A laser device, comprising:
a first mirror with a first surface;
a second mirror with a second surface at least partially facing the first surface of the first mirror, the first and second mirrors defining a resonant optical cavity in which electromagnetic energy is amplified by stimulated emission of coherent radiation that is partially transmitted through the second mirror;
a semiconductor optical amplifier disposed at least partially between the first and second surfaces;
wherein the semiconductor optical amplifier gain exceeds the loss within the resonant optical cavity over a broad spectral bandwidth;
an electrical or optical pump providing energy to the semiconductor optical amplifier; and
a graphene saturable absorber disposed at least partially between the first and second surfaces;
wherein the graphene saturable absorber operates in a passive mode;
wherein the laser device emits stimulated coherent radiation through the second mirror with center wavelengths of about 1,800 nm or more and about 25,000 nm or less; and
has a spectral width of about 0.006% or more of a center wavelength.

2. The laser device of claim 1, wherein the laser device is a mode-locked laser or a Q-switched laser configured to emit stimulated coherent radiation through the second mirror with center wavelengths of about 280 nm or more and about 1,800 nm or less.

3. The laser device of claim 1, wherein the semiconductor optical amplifier comprises a superlattice of alternating semiconductor layers of at least two different material compositions.

4. The laser device of claim 1, wherein the graphene saturable absorber is disposed between the first surface and the semiconductor optical amplifier.

5. The laser device of claim 4, wherein the semiconductor optical amplifier comprises opposite first and second ends, and wherein the graphene saturable absorber is integral with the first end of the semiconductor optical amplifier.

6. The laser device of claim 5, wherein the second mirror is integral with the second end of the semiconductor optical amplifier.

7. The laser device of claim 6, wherein the second mirror is a partially reflective facet on the second end of the semiconductor optical amplifier.

8. The laser device of claim 6, wherein the second mirror is a partially reflective coating on the second end of the semiconductor optical amplifier.

9. The laser device of claim 5, wherein the second mirror is spaced from the second end of the semiconductor optical amplifier.

10. The laser device of claim 9, wherein the second mirror is a Bragg mirror.

11. The laser device of claim 9, further comprising at least one optical component disposed between the second end of the semiconductor optical amplifier and the second mirror.

12. The laser device of claim 11, wherein the at least one optical component is a gas cell.

13. The laser device of claim 4, wherein the graphene saturable absorber is integral to the first mirror.

14. The laser device of claim 13, wherein the first mirror is formed as a highly reflective coating on the graphene saturable absorber.

15. The laser device of claim 13, wherein the first mirror is a Bragg mirror or a highly reflective coating on a substrate.

16. The laser device of claim 4, wherein the graphene saturable absorber is spaced from the semiconductor optical amplifier.

17. The laser device of claim 16, wherein the graphene saturable absorber is integral to the first mirror.

18. The laser device of claim 16, further comprising at least one optical component disposed between the first end of the semiconductor optical amplifier and the graphene saturable absorber.

19. The laser device of claim 18, wherein the at least one optical component is a gas cell.

20. The laser device of claim 16, further comprising at least one optical component disposed between the second end of the semiconductor optical amplifier and the second mirror.

21. The laser device of claim 20, wherein the at least one optical component is a gas cell.

22. The laser device of claim 4, wherein the graphene saturable absorber is spaced from the first mirror, further comprising at least one optical component disposed between the graphene saturable absorber and the first mirror.

23. The laser device of claim 22, wherein the at least one optical component is a gas cell.

24. The laser device of claim 22, wherein the graphene saturable absorber is integral with the semiconductor optical amplifier.

25. The laser device of claim 1, wherein the semiconductor optical amplifier is a quantum cascade semiconductor optical amplifier.

26. The laser device of claim 1, wherein the semiconductor optical amplifier is an interband cascade.

27. The laser device of claim 1, wherein the laser device is a frequency comb laser.

28. The laser device of claim 1, wherein the laser device is a mode-locked laser or a Q-switched laser configured to emit stimulated coherent radiation through the second mirror and having a spectral width of about 10% of a center wavelength.

29. The laser device of claim 1, wherein the laser device is a linear cavity or external cavity mode-locked laser or a Q-switched laser configured to emit stimulated coherent radiation through the second mirror.

30. The laser device of claim 1, having a spectral width of about 0.5% or more of a center wavelength.

31. The laser device of claim 30, having a spectral width of about 2.0% or more of the center wavelength.

32. The laser device of claim 31, having a spectral width of about 10.0% or less of the center wavelength.

* * * * *